US009639422B2

United States Patent
Troia (10) Patent No.: US 9,639,422 B2
(45) Date of Patent: May 2, 2017

(54) SYNCHRONIZED TRANSFER OF DATA AND CORRESPONDING ERROR CORRECTION DATA

(71) Applicant: MICRON TECHNOLOGY, INC., Boise, ID (US)

(72) Inventor: Alberto Troia, Carlentini (IT)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/072,572

(22) Filed: Mar. 17, 2016

(65) Prior Publication Data

US 2016/0196181 A1 Jul. 7, 2016

Related U.S. Application Data

(62) Division of application No. 13/490,690, filed on Jun. 7, 2012, now Pat. No. 9,323,608.

(51) Int. Cl.
*G11C 29/00* (2006.01)
*G11C 8/00* (2006.01)
*G06F 11/10* (2006.01)
*G06F 3/06* (2006.01)
*G11C 16/26* (2006.01)
(Continued)

(52) U.S. Cl.
CPC .......... *G06F 11/1068* (2013.01); *G06F 3/064* (2013.01); *G06F 3/0619* (2013.01); *G06F 3/0688* (2013.01); *G06F 11/1048* (2013.01); *G11C 16/26* (2013.01); *G11C 29/52* (2013.01); *H03M 13/13* (2013.01)

(58) Field of Classification Search
CPC ..... G11C 7/1051; G11C 7/1066; G11C 7/222; G11C 16/0483; G11C 2211/5641; G11C 29/00; G11C 29/54; G11C 5/04; G11C 8/16; G11C 7/1006; G06F 11/1072; G06F 12/06; G06F 12/0888; Y02B 60/1225; H03M 13/31

See application file for complete search history.

(56) References Cited

U.S. PATENT DOCUMENTS

| 4,214,303 A | 7/1980 | Joyce et al. |
| 4,672,614 A | 6/1987 | Yoshida |

(Continued)

FOREIGN PATENT DOCUMENTS

| JP | 07105102 A | 4/1995 |
| JP | 2000066962 A | 3/2000 |

(Continued)

OTHER PUBLICATIONS

JEDEC, "LPDDR-NVM Memory Standard", Arlington, VA, Nov. 29, 2007, 2 pgs.

(Continued)

*Primary Examiner* — Phung M Chung
(74) *Attorney, Agent, or Firm* — Dicke, Billig, Czaja, PLLC (57) ABSTRACT

Memory devices having a first plurality of data buffers coupled to sense circuitry, a second plurality of data buffers coupled to sense circuitry, and an error correction controller coupled to the first and second plurality of data buffers and configured to synchronize data from the first and second plurality of data buffers prior to transmitting the data, as well as systems containing such memory devices.

20 Claims, 10 Drawing Sheets

(51) Int. Cl.
  *G11C 29/52* (2006.01)
  *H03M 13/13* (2006.01)

(56) References Cited

U.S. PATENT DOCUMENTS

| | | | |
|---|---|---|---|
| 4,799,222 A | 1/1989 | Barlow et al. | |
| 5,345,582 A | 9/1994 | Tsuchiya | |
| 5,463,644 A * | 10/1995 | Rodi | G06F 11/1044 714/765 |
| 5,502,499 A * | 3/1996 | Birch | H04L 1/0057 327/106 |
| 5,583,562 A * | 12/1996 | Birch | H04L 1/0057 348/E5.108 |
| 5,678,020 A | 10/1997 | Singh et al. | |
| 5,757,416 A * | 5/1998 | Birch | H04L 1/0057 348/E5.108 |
| 5,793,774 A | 8/1998 | Usui et al. | |
| 5,825,788 A * | 10/1998 | Pawlowski | G06F 12/0877 710/34 |
| 5,841,795 A | 11/1998 | Olarig et al. | |
| 6,457,154 B1 | 9/2002 | Chen et al. | |
| 6,557,113 B1 * | 4/2003 | Wallentine | G11B 20/1403 360/48 |
| 6,912,616 B2 | 6/2005 | Heap | |
| 6,931,576 B2 | 8/2005 | Morrison et al. | |
| 6,954,871 B2 * | 10/2005 | Kuhn | G06F 13/161 713/401 |
| 7,023,736 B2 * | 4/2006 | Cernea | G11C 7/06 365/185.21 |
| 7,026,850 B2 | 4/2006 | Atyunin et al. | |
| 7,293,221 B1 | 11/2007 | Wong et al. | |
| 7,571,297 B2 | 8/2009 | Gould et al. | |
| 7,694,196 B2 | 4/2010 | Schnell et al. | |
| 7,747,933 B2 | 6/2010 | Johnson | |
| 7,804,735 B2 | 9/2010 | Mao et al. | |
| 7,840,875 B2 | 11/2010 | Conley | |
| 7,937,631 B2 | 5/2011 | Vogelsang | |
| 8,135,935 B2 | 3/2012 | Haertel et al. | |
| 8,775,901 B2 * | 7/2014 | Sharon | G06F 11/1048 714/763 |
| 8,879,351 B2 * | 11/2014 | Kim | G11C 5/025 365/174 |
| 2005/0114750 A1 | 5/2005 | Deegan et al. | |
| 2005/0125708 A1 | 6/2005 | Simon | |
| 2006/0123320 A1 | 6/2006 | Vogt | |
| 2006/0203601 A1 | 9/2006 | Pawlowski | |
| 2007/0088921 A1 | 4/2007 | Kim et al. | |
| 2007/0133315 A1 | 6/2007 | Kang et al. | |
| 2007/0250756 A1 | 10/2007 | Gower et al. | |
| 2008/0168331 A1 | 7/2008 | Vogelsang et al. | |
| 2009/0013233 A1 | 1/2009 | Radke | |
| 2009/0070654 A1 * | 3/2009 | Flachs | G06F 11/1044 714/758 |
| 2009/0271678 A1 | 10/2009 | Schneider et al. | |
| 2010/0318718 A1 | 12/2010 | Eilert et al. | |
| 2011/0205418 A1 * | 8/2011 | Fujita | H04N 3/1568 348/308 |
| 2011/0289380 A1 * | 11/2011 | Wilkerson | G06F 11/1064 714/763 |
| 2012/0173956 A1 * | 7/2012 | Jeon | G06F 11/1044 714/773 |
| 2012/0246542 A1 | 9/2012 | Moyer et al. | |

FOREIGN PATENT DOCUMENTS

| | | |
|---|---|---|
| JP | 2008090442 A | 4/2008 |
| JP | 2010-003389 A | 1/2010 |
| JP | 2011-108252 A | 6/2011 |

OTHER PUBLICATIONS

JEDEC, "Low Power Double Data Rate (LPDDR) Non-Volatile Memory (NVM) Specification", Arlington, VA Jan. 2007. 70 pgs.

* cited by examiner

SYNCHRONIZED TRANSFER OF DATA AND CORRESPONDING ERROR CORRECTION DATA

RELATED APPLICATION

This Application is a Divisional of U.S. application Ser. No. 13/490,690, titled "IMPROVING INTEGRITY OF A DATA BUS," filed Jun. 7, 2012, now U.S. Pat. No. 9,323,608 issued on Apr. 26, 2016 which is commonly assigned and incorporated herein by reference.

TECHNICAL FIELD

The present embodiments relate generally to memory and a particular embodiment relates to improving the integrity of a data bus of a memory.

BACKGROUND

Memory is typically provided as an integrated circuit(s) formed in and/or on semiconductor die(s), whether alone or in combination with another integrated circuit(s), and is commonly found in computers or other electronic devices. There are many different types of memory including random-access memory (RAM), read only memory (ROM), dynamic random access memory (DRAM), synchronous dynamic random access memory (SDRAM), and flash memory.

Flash memories have developed into a popular source of non-volatile memory for a wide range of electronic applications. Flash memories typically use a one-transistor memory cell that allows for high memory densities, high reliability, and low power consumption. Changes in threshold voltage of the cells, through programming of a charge storage structure, such as floating gates or trapping layers or other physical phenomena, determine the data state of each cell. Common uses for flash memory include personal computers, digital cameras, digital media players, digital recorders, games, appliances, vehicles, wireless devices, cellular telephones, and removable memory modules.

Figure 1:
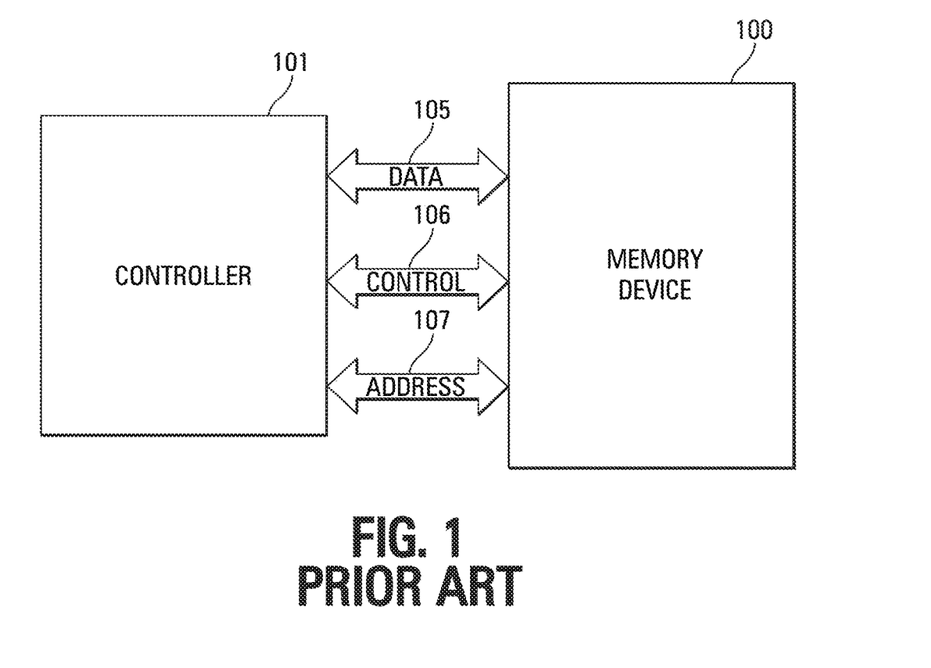
FIG. 1 shows a typical prior art system.

FIG. 1 illustrates one example of a typical prior art system that incorporates a flash memory device 100. The system also includes a controller 101 that is coupled to the memory device 100.

The controller 101 is shown coupled to the memory device 100 over a data bus 105, a control bus 106, and an address bus 107. In one embodiment, the data bus could be a 32 bit and/or 16 bit wide double data rate (DDR) bus.

If the system of FIG. 1 was incorporated into an electrically noisy environment such as an automobile or an aircraft, it could be subjected to a substantial amount of noise due to, for example, ignition systems and/or communication systems. Thus the integrity of the various buses 105-107 could be compromised. Various standards (e.g., ISO26262) have been implemented to ensure the integrity of information over the buses by providing guidelines as to suggested integrity standards.

For the reasons stated above and for other reasons that will become apparent to those skilled in the art upon reading and understanding the present specification, there is a need in the art to increase the integrity of one or more of the buses in a system.

DETAILED DESCRIPTION

In the following detailed description, reference is made to the accompanying drawings that form a part hereof and in which is shown, by way of illustration, specific embodiments. In the drawings, like numerals describe substantially similar components throughout the several views. Other embodiments may be utilized and structural, logical, and electrical changes may be made without departing from the scope of the present disclosure. The following detailed description is, therefore, not to be taken in a limiting sense.

Figure 2:
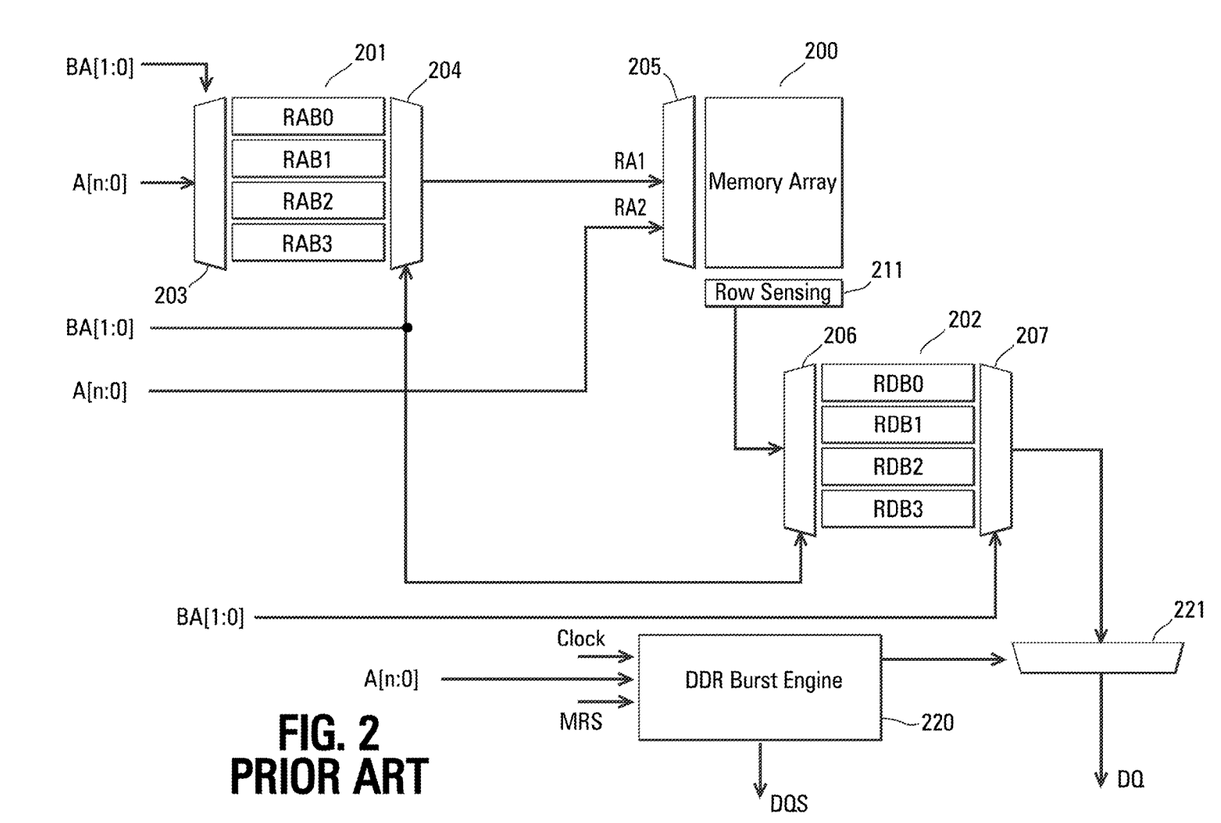
FIG. 2 shows a block diagram of a typical prior art implementation of a JEDEC compliant read operation.

FIG. 2 illustrates a block diagram of a typical prior art Joint Electron Devices Engineering Council (JEDEC)-compliant implementation of a read operation in a non-volatile memory device (NVM-LPDDR). As is well known in the art, JEDEC standards provide standardization of electronic components (e.g., non-volatile memory, controllers) so that one JEDEC-compliant memory device or controller from one manufacturer can be replaced with a similar JEDEC-compliant memory device or controller from another manufacturer. While subsequent discussions of the embodiments for improving the integrity of a data bus refer to JEDEC implementations of command, address, and data formats, the present embodiments are not limited to any one standard or format.

In the JEDEC implementation illustrated, the address A[n:0] is divided into two parts. These two parts are subsequently referred to as row address 1 (RA1) for the first part and row address 2 (RA2) for the second part. The RA1 is stored in one of a set of row address buffers 201 that are labeled RAB0-RAB3. A JEDEC control signal BA[1:0] is a buffer select signal that selects which of the row address buffers 201 is to store RA1 by controlling which output of a multiplexer 203 is connected to the first part RA1 of the input address.

The control signal BA[1:0] is active during Pre-Active and Active time periods (as discussed subsequently with reference to FIG. 3) in order to select which specific page is needed to be read from the memory array 200. This signal can have one of four different states (e.g., 00, 01, 10, 11) in order to select one of the four address buffers 201. The control signal BA[1:0] is also used to control an output multiplexer 204 that is coupled to and selects one of the outputs of the row address buffers 201.

Both of the first and second parts of the address (RA1 and RA2) are input to the memory array 200 through another multiplexer 205 during a read operation. The memory array 200 is also coupled to a row sensing circuit 211 that senses the state of particular memory cells that are selected in response to the two row address parts.

The output of the row sensing circuit 211 is coupled to a set of row data buffers 202 RDB0-RDB3 through a multiplexer 206 that is controlled by the BA[1:0] signal. Thus, the BA[1:0] signal selects into which row data buffer 202 the sensed data is input. Similarly, the BA[1:0] signal is used as a control input to an output multiplexer 207 that is coupled to the outputs of the row data buffers 202 to select which of the buffer outputs is coupled to a data output multiplexer 221.

A double data rate (DDR) burst engine 220 is coupled to the control input of the data output multiplexer 221. The DDR burst engine 220 uses a clock, the ROW and COLUMN address, and bits in the mode register set (MRS) register to control the burst output of data (DQ) from the DQ multiplexer 221.

Figure 3:
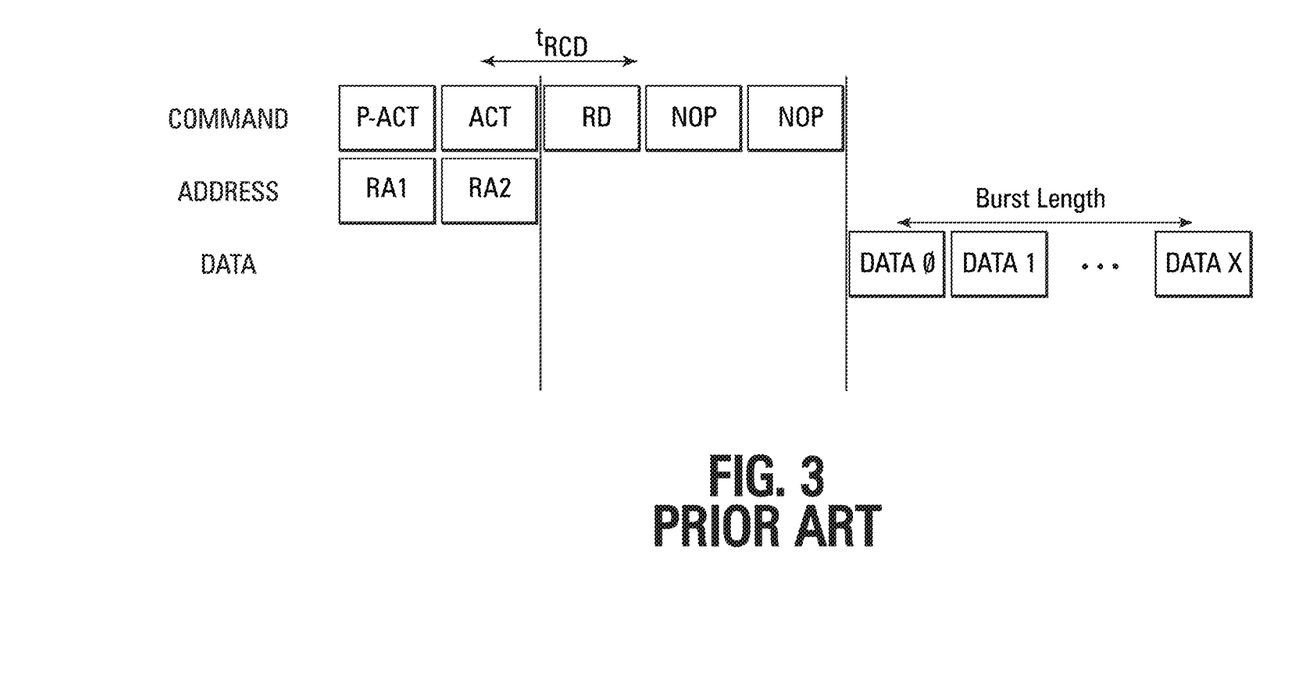
FIG. 3 shows a timing diagram of a typical prior art command and address sequence in accordance with the embodiment of FIG. 2.

FIG. 3 illustrates a timing diagram of a typical prior art command and address sequence in accordance with the embodiment of FIG. 2. This figure shows what is occurring on each of the command, address, and data buses between a memory device and an external controller.

Referring to both FIGS. 2 and 3, the command bus initially has a JEDEC pre-active instruction (P-ACT). This instruction instructs the memory device to accept the first part of the address (RA1) that is on the address bus. The first part of the address is input to the row address buffers 201 RAB0-RAB3 based on the BA[1:0] signal.

After the P-ACT instruction, the command bus has a JEDEC active (ACT) instruction that instructs the memory device to accept the second part of the address RA2 that is on the address bus. Additionally during the ACT instruction, RA2 is applied to the memory array with the first part of the address RA1. The array sensing is also initiated by the ACT instruction.

After the ACT instruction, the command bus has a read instruction (RD) that instructs the memory device to select the first page(s) of the selected row data buffer 202 RDB0-RDB3 based on the BA[1:0] signal. The selected data is output to the DQ output.

The command bus also includes a plurality of no-operation (NOP) instructions after the read instruction RD. The NOP instructions are included as part of a particular JEDEC standard to increase the latency. In the illustrated embodiment, two NOP instructions are used on the command bus to generate column address strobe latency of three. However, alternate embodiments that use other standards can use more or less NOP instructions to adjust the latency.

The selected read data (RD) are now available on the data bus. FIG. 3 shows a plurality of read data (DATA0-DATAx) on the data bus as determined by the burst length. The burst length is the number of data words that are requested by the controller to be read.

FIG. 3 also shows a time $t_{RCD}$ that represents the minimum time between the ACT instruction and the RD instruction. This is a predetermined time that is set by a particular JEDEC standard (e.g., low power double data rate (NVM-LPDDR)) that any compliant device should respect for proper operation. The particular JEDEC standard allows NOP instructions to be inserted between instructions on the command bus that adjusts the time between the ACT instruction and the RD instruction in order to meet this time specification.

A block diagram of a typical prior art JEDEC-compliant implementation of a write operation in a non-volatile memory device is substantially the same as the block diagram of FIG. 2. The main difference is that the controller provides the data to be written to the memory array instead of the memory array, sensing circuit, row data buffers, and DQ outputs providing a data output.

Figure 4:
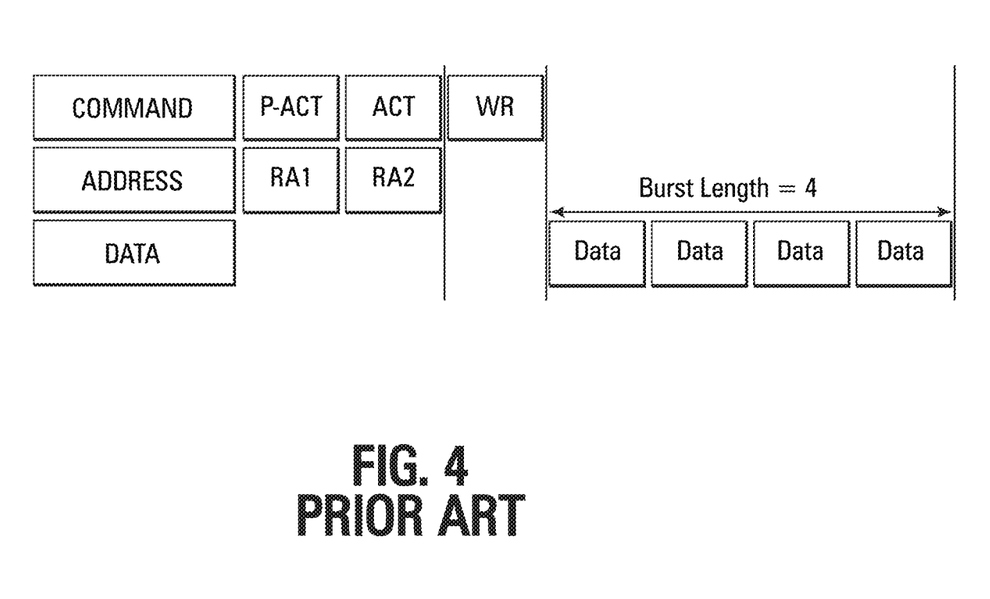
FIG. 4 shows a timing diagram of a typical prior art command and address sequence of a JEDEC-compliant write operation.

FIG. 4 illustrates a timing diagram of a typical prior art command and address sequence of such a JEDEC-compliant write operation. The command bus initially has a JEDEC pre-active instruction (P-ACT). This instruction instructs the memory device to accept the first part of the address (e.g., RA1) that is on the address bus. The first part of the row address is input to the row address buffers 201 RAB0-RAB3 based on the BA[1:0] signal.

After the P-ACT instruction, the command bus has a JEDEC active (ACT) instruction that instructs the memory device to accept the second part of the address (e.g., RA2) that is on the address bus. Additionally during the ACT instruction, RA2 is applied to the memory array with the first part of the row address RA1.

After the ACT instruction, the command bus has a write instruction (WR) that instructs the memory device to accept the data that is on the data bus (DATA). This data is then stored in the memory array at the address transmitted over the address bus. The embodiment of FIG. 4 shows a burst length of 4.

In order to provide increased data bus integrity, the present embodiments use an error detection and correction algorithm (EDAC) on associated data. In one embodiment, the EDAC is executed by the host controller prior to transmitting the data. The resulting error correction code (ECC) data is also transmitted to the memory device to be stored in the memory array along with the corresponding data, if necessary, and an enable/disable flag (EDAC_F).

The enable/disable flag is set and transmitted by the external controller and read by the receiving memory device to determine whether to attempt to correct the corresponding data with the ECC data prior to storing both (e.g., data bus integrity feature enabled). If the enable/disable flag indicates that the data bus integrity feature has been disabled (e.g., EDAC_F="0"), the memory device does not attempt to perform error correction on the corresponding data.

Figure 5:
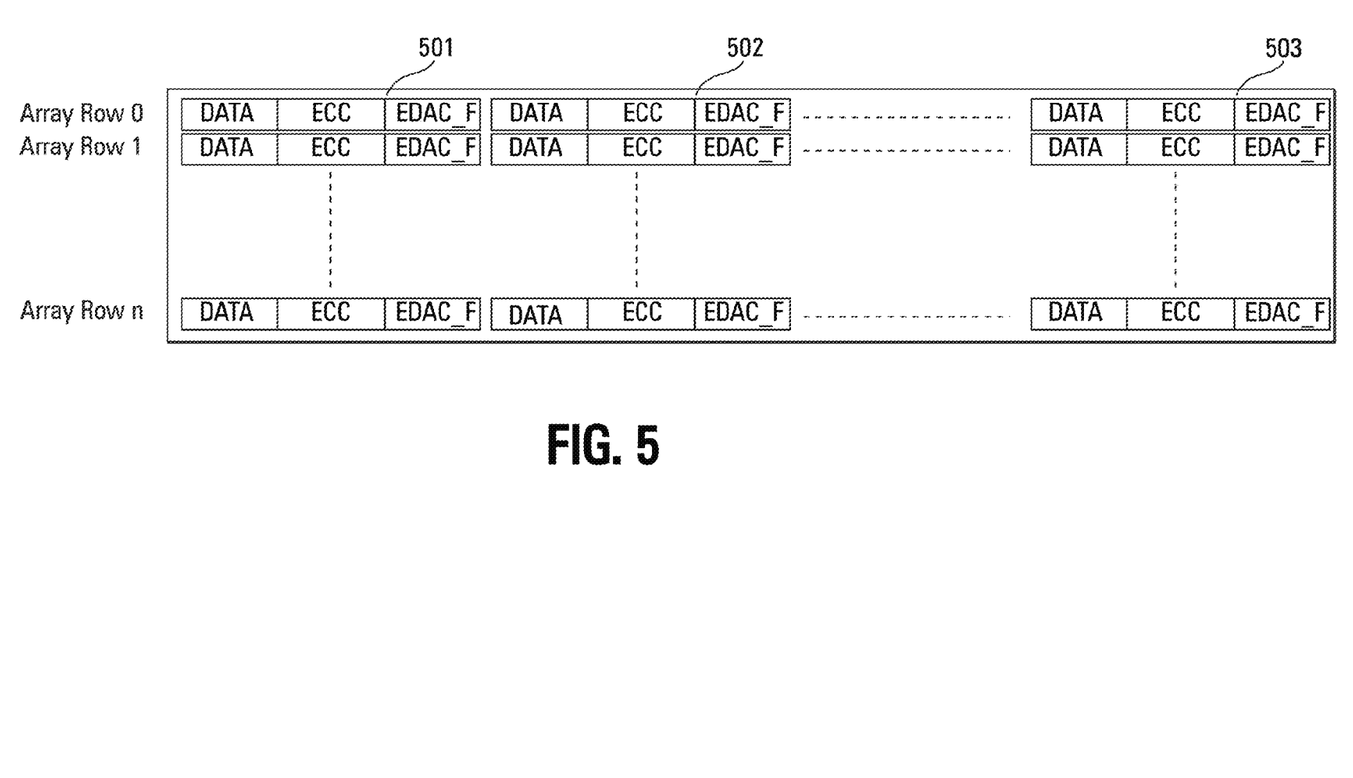
FIG. 5 shows a format for data storage in a memory array in accordance with improving integrity of a data bus.
Figure 6:
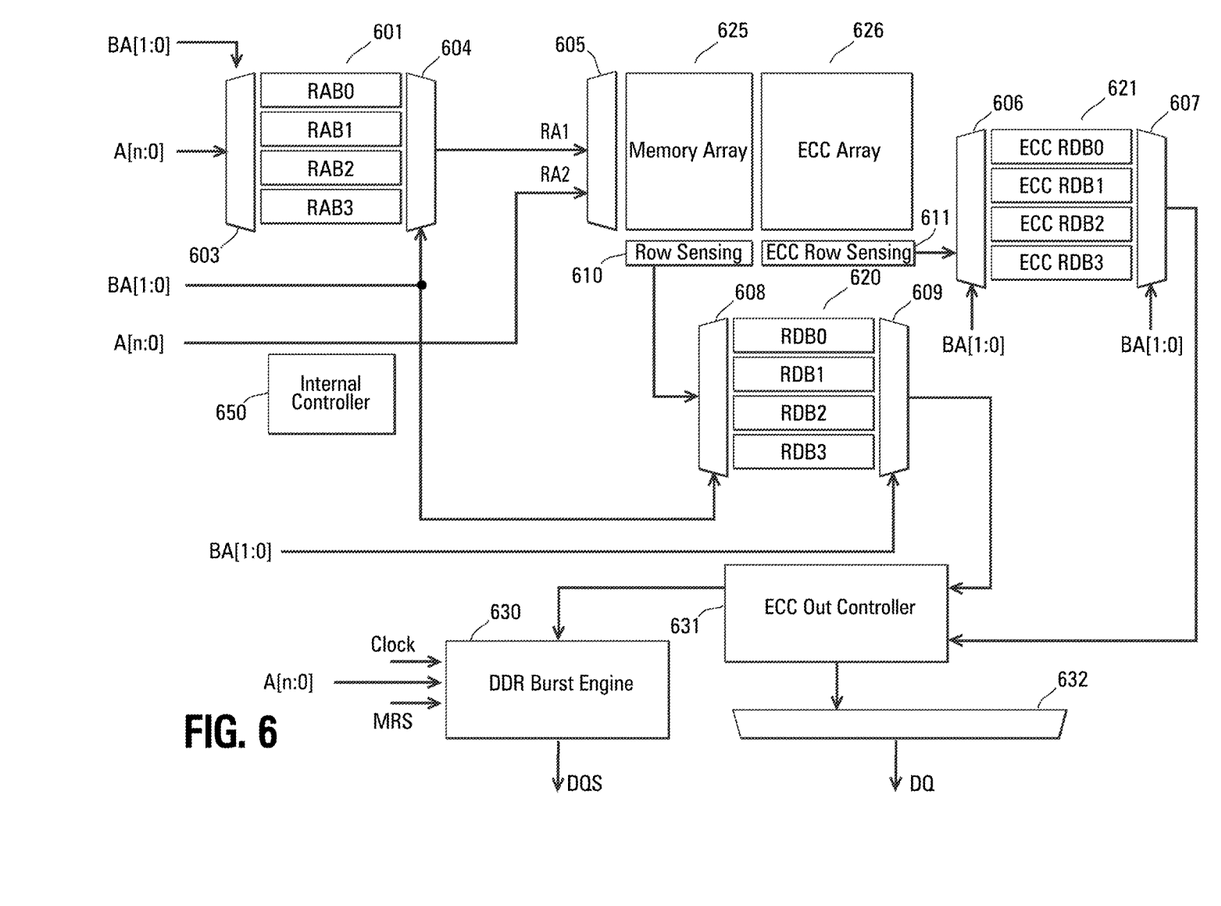
FIG. 6 shows a block diagram of one embodiment of an implementation of a read operation for improving integrity of a data bus.

FIG. 5 illustrates a format for storing ECC data, the corresponding data (DATA), and the enable/disable flag (EDAC_F) in data slots 501-503 of a memory array 625 and an ECC data array 626 (see FIG. 6). The format illustrated in FIG. 5 is only for illustration since other formats can be used.

FIG. 5 illustrates Array Rows 0-$n$. Each row comprises a series of the data slots 501-503 that match the format of the Row Data Buffer content as discussed subsequently with reference to FIGS. 6 and 8. Each row of the memory array 625 and ECC data array 626 can comprise a plurality of these data slots 501-503. In one embodiment, each data slot 501-503 can comprise 32 bytes of data (DATA) plus the overhead (ECC, EDAC_F) associated with improving the integrity of the data bus.

The burst length of the data depends on the internal architecture of the device (e.g., 16, 32, 64 bits). The length of the error correction data can depend on the type of error detection and correction algorithm used on the corresponding data. The EDAC_F flag (e.g., enabled or disabled) can comprise a single bit. However, alternate embodiments can use other quantities of enable/disable bits.

The length of each slot in bits can be represented by "Y×T" bits for the data, where "Y" represents the data bus size (e.g., 16, 32, or 64 bits) and "T" represents the burst length (e.g., the number of data words being transmitted over the data bus as a result of one read command), plus the ECC data size (e.g., in bits) and the EDAC_F flag. For example, in a 16 bit memory device (e.g., data bus is 16 bits), Y=16. Assuming a burst length of 4, the corresponding data size for each slot would be 16×4=64 bits. The ECC data corresponding to the 64 bits of data might be 4 bits and the EDAC_F flag might be one bit. Thus, one slot might be 64+4+1=69 bits.

Figure 7:
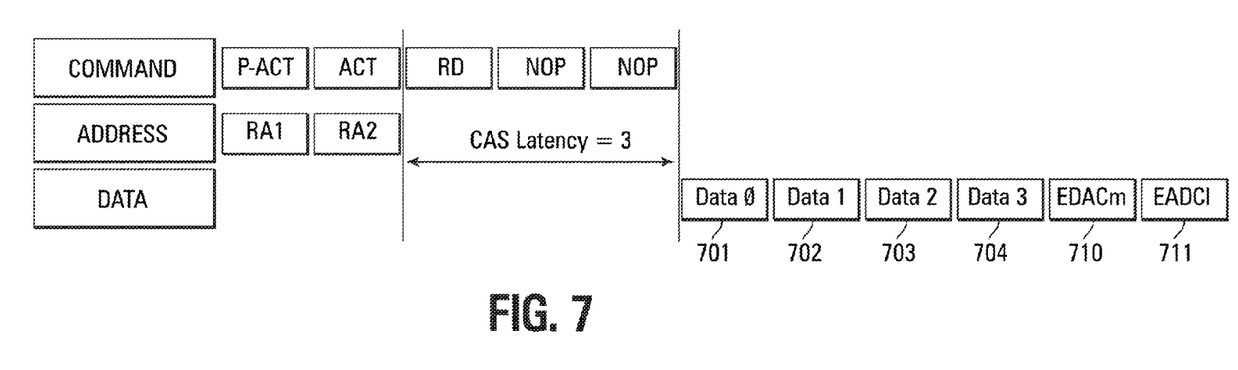
FIG. 7 shows a timing diagram of command and address sequence for a read operation in accordance with a method for improving integrity of a data bus.

FIG. 6 illustrates a block diagram of one embodiment of a JEDEC-compliant implementation of a read operation that is implemented with the data bus integrity feature as illustrated in the read operation timing diagram of FIG. 7. Alternate embodiments can implement the data bus integrity feature using different standards than the JEDEC standard illustrated.

Referring to FIGS. 6 and 7, responsive to the P-ACT instruction on the command bus, a first part of the row address (RA1) is stored in one of the row address buffers 601 RAB0-RAB3. The address A[n:0] is applied to an input address multiplexer 603 that is controlled by the JEDEC control signal BA[1:0]. The input address multiplexer 603 then accepts only RA1 for storage in the selected row address buffer 601 RAB0-RAB3 as controlled by BA[1:0]. The outputs of the multiplexer 603 are each coupled to a different one of the row address buffers RA0-RA3. The row address buffers 601 RAB0-RAB3 are coupled to an output address multiplexer 604 that is also controlled by the BA[1:0] signal.

Responsive to the ACT instruction on the command bus, a second part of the address (RA2) is input to an address multiplexer 605. A selected one of the RA1 addresses, as selected by BA[1:0] from one of the row address buffers RA0-RA3 through the output multiplexer 604, is also input to the address multiplexer 605 coincident with inputting RA2 to the multiplexer 605. The output of the address multiplexer 605 is coupled to a memory array 625 where the corresponding data to be read are stored. An ECC data array 626 is also coupled to the output of the address multiplexer 605 and is addressed by the same RA1 and RA2 address parts. The memory array 625 and ECC data array 626 sensing through row sense circuitry 610 and ECC row sense circuitry 611, respectively, is initiated by the ACT instruction.

The row data and the ECC data are stored in separate data buffers 620, 621 during the read operation. The row data are stored in row data buffers 620 RDB0-RDB3 while the ECC data are stored in row ECC data buffers 621 RBD0-RBD3. The sensed row data from the row sensing circuitry 610 are input to the set of row data buffers 620 RDB0-RDB3 through an input multiplexer 608 that is controlled by the BA[1:0] signal. The sensed ECC data from the ECC row sensing circuitry 611 are input to the set of row ECC data buffers 621 ECC RBD0-RBD3 through an ECC input multiplexer 606 that is controlled by the BA[1:0] signal.

Figure 8:
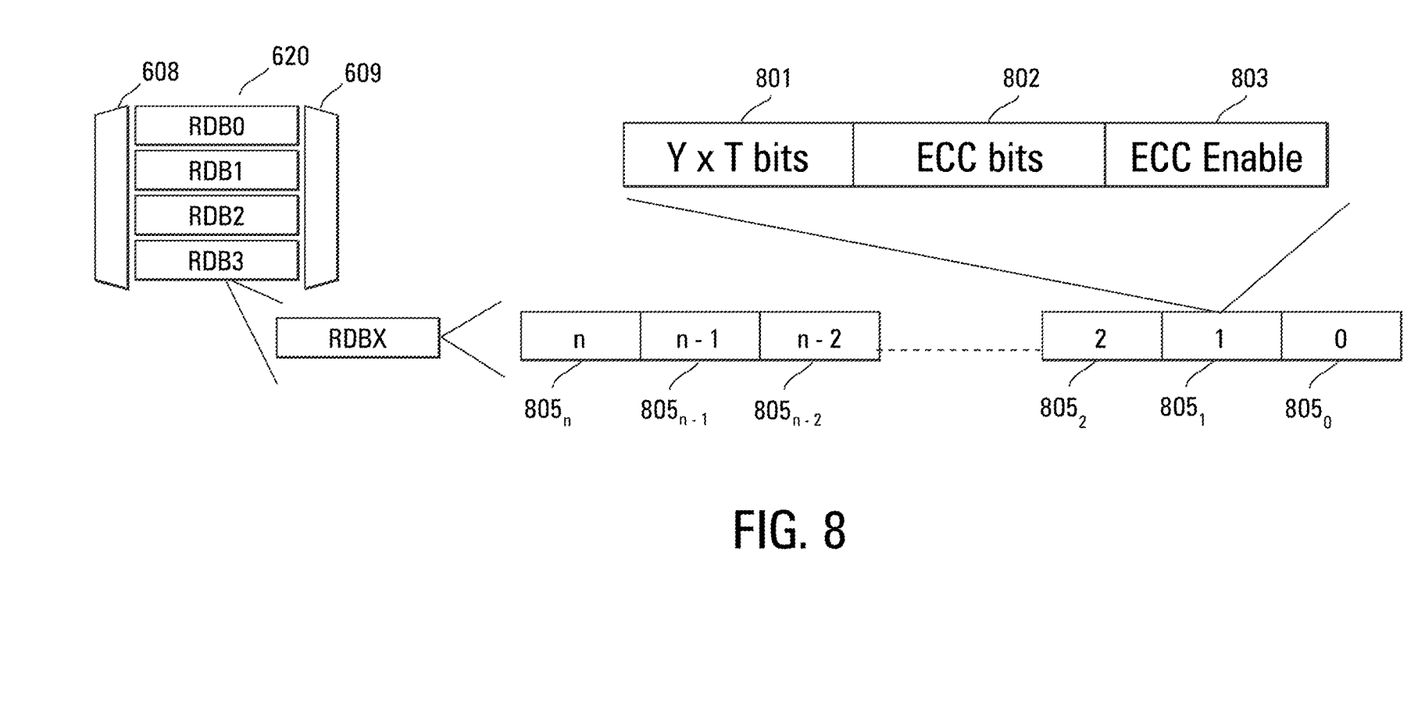
FIG. 8 shows a format of data in a row data buffer in accordance with the embodiment of FIG. 6.

One format for the row data buffers 620 RDB0-RDB3 is illustrated in FIG. 8. This format is represented generically as RDBx since any of the buffers 620 RDB0-RDB3 can have this format. Each buffer 620 (e.g., RDB0, RDB1, RDB2, or RDB3) can have n data slots (e.g., $805_0$-$805_n$) where each data slot 805 comprises "Y×T" bits of corresponding data 801, sensed ECC data bits 802 corresponding to data 801, and the ECC enable/disable flag 803 (e.g., EDAC_F). These various bits have been discussed previously with reference to FIG. 5.

As one example, the size of each row data buffer RDB0-RDB3 in a 16 bit device (e.g., Y=16 bits) can be determined by "pn*(IO+ECC+Enable)" where "pn" is the number of pages to be read (e.g., 2 pages), IO is the size of the data bus (e.g., 16 bits), "ECC" is the number of ECC data bits (e.g., 4 bits) for correcting the corresponding data, and "Enable" is the number of enable/disable flag bits (e.g., 1 bit). This same algorithm can be used in alternate embodiments with different size data buses (e.g., 32 bits, 64 bits).

During the RD instruction (see FIG. 7) on the command bus, each of the row data buffers 620 RDB0-RDB3 is selected through a multiplexer 609 that is coupled to the outputs of the row data buffers 620 RDB0-RDB3 and controlled by the BA[1:0] signal. Similarly, during the RD instruction, each of the ECC data buffers 621 is selected through a multiplexer 607 that is coupled to the outputs of the ECC data buffers 621 RBD0-RBD3 and controlled by the BA[1:0] signal. Referring to FIG. 7, one or more NOP instructions are added after the RD instruction in order to increase the command address strobe (CAS) latency. In the illustrated embodiment, two NOP instructions are added to create a CAS latency of three.

The outputs of the corresponding data and ECC data multiplexers 607, 609 are input to an ECC Out Controller 631. This controller 631 is, in one embodiment, a memory circuit that drives the data out of the memory device through a DQ multiplexer 632. The ECC Out Controller 631 receives the ECC data from the ECC data buffers 621 and synchronizes the output of the ECC data with the corresponding data from the row data buffers 620 as shown in FIG. 7 and described subsequently.

A double data rate (DDR) Burst Engine 630 is coupled to the ECC Out Controller 631. The DDR Burst Engine 630 uses inputs comprising a clock, the RDB size, a mode register set (MRS) signal (a plurality of bits that configure the data out such as clock latency and pages to be read), and the output data (e.g., data and corresponding ECC data) to generate a DQS signal. The DQS signal is a data strobe signal that is asserted high or low together with the DQ signal (e.g., data) when the memory is transmitting the data to the controller and permits the controller to sample the data when they are stable on the bus. In one embodiment, the DDR Burst Engine 630 can set the burst length and rate in response to particular bits in a control register such as the MRS register.

The memory array 625 and the ECC data array 626 can comprise one of a plurality of technologies. For example, they can comprise a plurality of memory cells in a NOR, NAND, or Phase Change Memory (PCM) architecture. The memory array 625 and ECC data array 626 can also be volatile memory arrays such as dynamic random access memory. Other memory technologies can also use the method for improving data bus integrity.

In one embodiment, the block diagram of FIG. 6 is showing a logical division of the memory array 625 and the ECC data array 626. These arrays 625, 626 can be the same physical array of memory cells. In an alternate embodiment, the memory array 625 and the ECC data array 626 are two separate physical memory arrays.

In one embodiment, errors could be corrected by the memory device but there could be other implementations where the memory does not apply any correction. Errors in the data to be stored in the memory array 625 have already been corrected (if enabled and warranted) by the memory device, using the ECC data, prior to being stored. The corrected data is stored along with the ECC data used to correct the corresponding data. When the associated data and the ECC data are read by the external controller, the external controller can use the ECC data for detecting and/or correcting transmission, program, and/or read errors in the stored data.

FIG. 7 additionally shows the data 701-704 transmitted over the data bus to the controller in response to the RD instruction from the controller. The data DATA0-DATA3 is represented by the four DATA packets 701-704. The ECC data 710, 711 is appended to the data 701-704 on the data bus. The ECC data 710, 711 is labeled as EDACm and EDAC1 to represent the two packets of ECC data where "m" represents the most significant packet and "1" represents the least significant packet.

The size of each ECC data packet 710, 711 is determined by the IO size (e.g., 16 bit, 32 bit). Transmitting the ECC data packets 710, 711 in two packets can be done to maintain compatibility with a certain JEDEC specification (e.g., LPDDR Non-volatile Memory Specification). By transmitting the ECC data packets 710, 711 as two separate packets, the Read-to-Read, Write-to-Write, Write-to-Active, and the Brst Termination protocols in this particular specification can be maintained. Alternate embodiments can transmit the ECC data packets 710, 711 in different formats.

Figure 9:
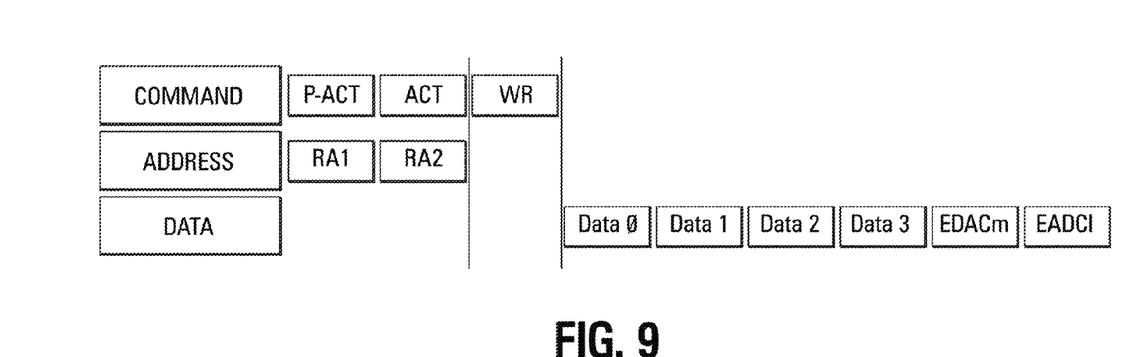
FIG. 9 shows a timing diagram of a command and address sequence for a write operation in accordance with a method for improving integrity of a data bus.

Both FIGS. 7 and 9 illustrate a burst length of four data packets with two ECC data packets. Alternate embodiments can have different burst lengths. For example, a burst length of eight might comprise a series of four associated data packets, two appended ECC data packets, four data packets, and two appended ECC data packets. Additional burst lengths can be achieved in a substantially similar manner.

In yet another alternate embodiment, all of the ECC data packets might be appended to the end of all of the corresponding data packets. For example, a burst length of eight might include eight data packets followed by four ECC data packets.

FIG. 9 illustrates a timing diagram of one embodiment of a command and address sequence for a write operation in accordance with a method for improving integrity of a data bus. The write operation can use the same block diagram as depicted in FIG. 6 with the exception that the data and ECC data are being transmitted from the controller to the memory device over the data bus to be stored in the memory array(s).

FIG. 9 illustrates that the P-ACT instruction is transmitted by the external controller over the command bus coincident with the row address 1 (e.g., RA1) over the address bus (e.g., transmitting at least a portion, and in some embodiments all, of the row address RA1 at a time that would be operative with respect to at least a portion, and in some embodiments all, of the P-ACT instruction; this can include, but is not limited to, for example, transmitting the row address and the P-ACT instruction at a same time, transmitting the row address while transmitting the P-ACT instruction and/or transmitting the row address during transmission of the P-ACT address). Similarly, the ACT instruction is transmitted by the external controller over the command bus coincident with the row address 2 (e.g., RA2) over the address bus. The write instruction WR is then transmitted by the external controller over the command bus that instructs the memory to store the data (DATA0-DATA3) subsequently transmitted over the data bus to the memory array. The external controller has performed the EDAC algorithm on the data to be transmitted and has appended the ECC data (EDACm, EDAC1) to the transmitted data.

The memory device internal controller 650 (see FIG. 6) uses the received ECC data EDACm and EDAC1 to attempt to correct any errors in the received data from the external controller. The corrected data can then be stored in the memory array along with the ECC data used to correct the data. In one embodiment, another memory controller might only store the ECC data without executing any correction.

Both FIGS. 7 and 9 illustrate a burst length of four data packets with two ECC data packets. Alternate embodiments can have different burst lengths. For example, a burst length of eight might comprise a series of four data packets, two appended ECC data packets, four data packets, and two appended ECC data packets. Additional burst lengths can be achieved in a substantially similar manner.

In yet another alternate embodiment, all of the ECC data packets might be appended to the end of all of the corresponding data packets. For example, a burst length of eight might include eight data packets followed by four ECC data packets.

Figure 10:
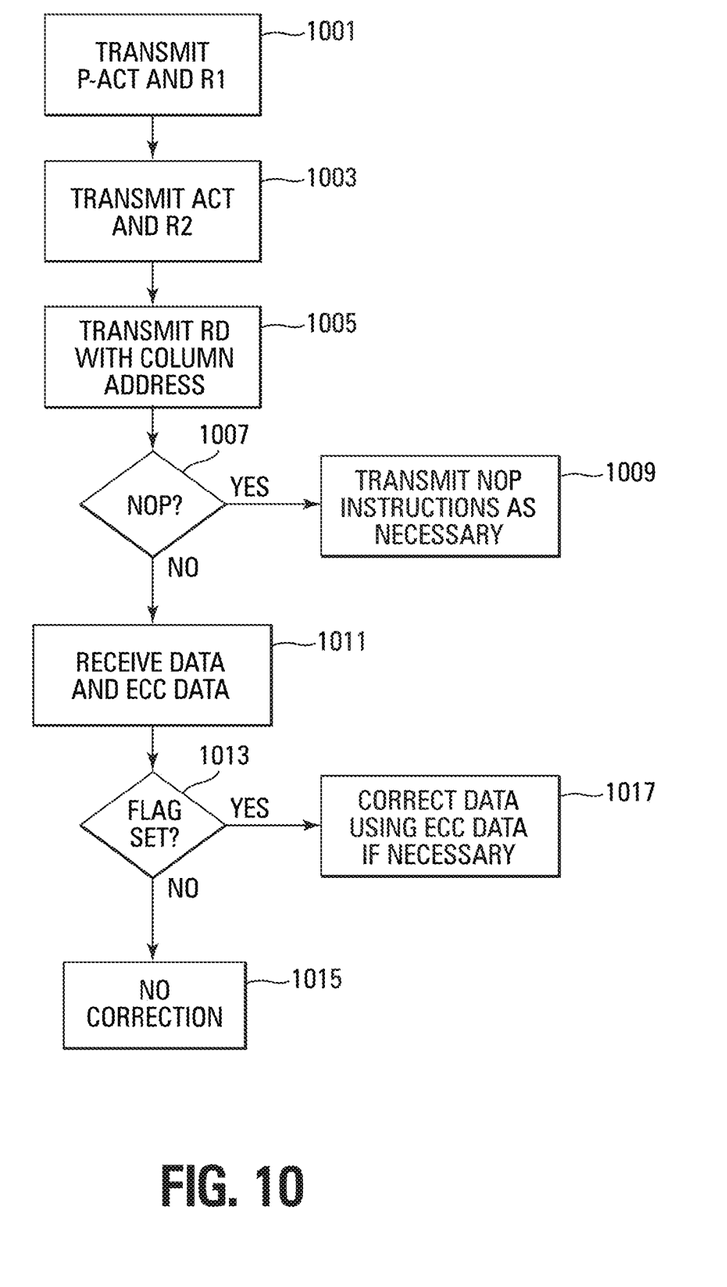
FIG. 10 shows a flow chart of one embodiment of a read operation using a method for improving data bus integrity in a memory system.

FIG. 10 illustrates a flow chart of one embodiment of a read operation using a method for improving data bus integrity in a memory system. A P-ACT instruction is transmitted by the external controller over the command bus coincident with transmitting a row address 1 (e.g., RA1) over the address bus 1001. An ACT instruction is transmitted by the external controller over the command bus coincident with a row address 2 (e.g., RA2) over the address bus 1003.

A RD instruction is transmitted with the column address by the external controller over the command bus 1005. If necessary for Column Address Strobe latency 1007, a plurality of NOP instructions are transmitted by the external controller over the command bus 1009. If not, in response to the RD instructions, the memory device responds back with the read data and corresponding ECC correction data 1011. As previously discussed, the ECC correction data can be transmitted in two ECC data packets as a most significant ECC packet (e.g., EDACm) and a least significant ECC packet (e.g., EDAC1) for the corresponding read data (e.g., burst length=4). The external controller can then determine whether to correct the received data using the ECC correction data. If the feature is enabled, the external controller uses the ECC correction data to attempt to correct any errors.

Determining whether to correct the received data can be accomplished, in one embodiment, by first reading the data bus integrity enable/disable flag 1013. If the flag indicates that the feature is disabled, no correction is attempted with the ECC data 1015. If the flag indicates that the feature is enabled but the data does not contain any errors, then no further correction is necessary 1017. Only when the flag indicates that the feature is enabled and the received data comprises at least one error does the external controller attempt to correct the data using the ECC data 1017.

Figure 11:
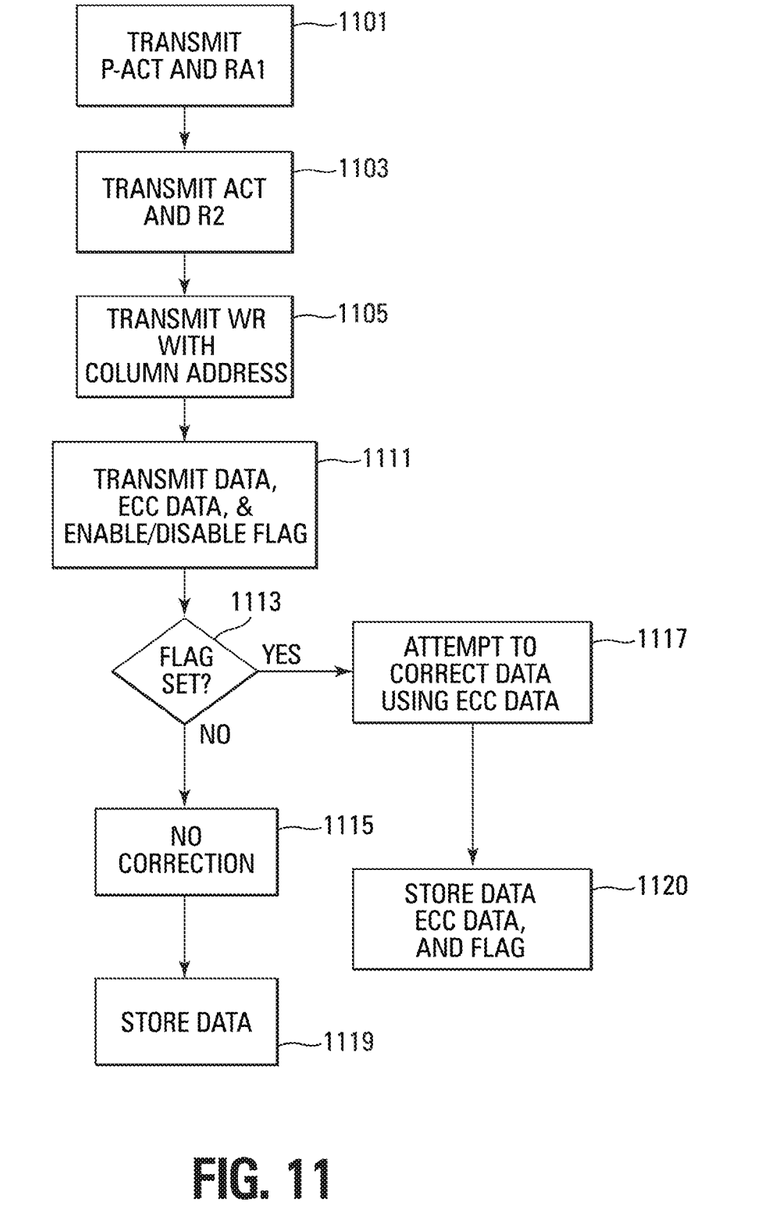
FIG. 11 shows a flow chart of one embodiment of a write operation using a method for improving data bus integrity in a memory system.

FIG. 11 illustrates a flow chart of one embodiment of a write operation using a method for improving data bus integrity in a memory system. A P-ACT instruction is transmitted by the external controller over the command bus coincident with transmitting a row address 1 (e.g., RA1) is transmitted over the address bus 1101. An ACT instruction is transmitted by the external controller over the command bus coincident with transmitting a row address 2 (e.g., RA2) over the address bus 1103.

A WR instruction is transmitted with the column address by the external controller over the command bus 1105. Data to be stored, ECC data and the enable/disable flag are then transmitted over the data bus 1111. As previously discussed, the external controller can either set the flag to indicate that the ECC data is to be used or leave it unset to indicate that the ECC data is not to be used.

The memory device reads the enable/disable flag to determine its status 1113. If the flag is set and the data contains errors, the memory device attempts to correct the data using the ECC data 1117. The corrected data, the flag and the corresponding ECC data are then stored in the memory array 1120. If the flag is set but the data does not contain any errors, the received data, the flag and the ECC data 1120 are stored.

If the flag is not set, no correction of the received data is attempted by the memory device 1115. The uncorrected data are stored in the memory array 1119 and the EDAC flag is left cleared. In one embodiment, the ECC data stream could be ignored.

As discussed previously, the methods illustrated in FIGS. 10 and 11 are based on one particular JEDEC standard (e.g., LPDDR Non-Volatile Memory Specification). Alternate embodiments do not require particular instructions like "P-ACT" and "ACT" for proper operation of the method for improving data bus integrity in a memory system.

CONCLUSION

In summary, one or more embodiments include a selectable data bus integrity feature that can improve the integrity of a data bus in a memory system. When the feature is enabled, the controller generates error correction data corresponding to data it is to transmit. The error correction data is divided into multiple data packets and appended to corresponding data for transmission over the data bus. The memory device can then use the ECC data, if the feature is enabled, to correct the received data and then store both the corrected data and corresponding ECC data. During a read operation, the memory device transmits both the stored data and the ECC data to the external controller. The external controller can then use the ECC data to attempt to correct read or transmission errors in the corresponding data.

Although specific embodiments have been illustrated and described herein, it will be appreciated by those of ordinary skill in the art that any arrangement that is calculated to achieve the same purpose may be substituted for the specific embodiments shown. Many adaptations of the invention will be apparent to those of ordinary skill in the art. Accordingly, this application is intended to cover any adaptations or variations of the invention.

What is claimed is:

1. A memory device comprising:
a first memory array configured to store data;
a second memory array configured to store error correction data;
first sense circuitry coupled to the first memory array;
second sense circuitry coupled to the second memory array;
a first plurality of data buffers coupled to the first sense circuitry;
a second plurality of data buffers coupled to the second sense circuitry; and
a controller coupled to the first and second plurality of data buffers and configured to synchronize data from the first plurality of data buffers resulting from a read operation with error correction data from the second plurality of data buffers resulting from the read operation prior to transmitting the data and the error correction data.

2. The memory device of claim 1, wherein the first and second memory arrays comprise one of a NAND, NOR, or AND non-volatile memory architecture.

3. The memory device of claim 1, wherein the first memory array and the second memory array comprise a same physical array of memory cells.

4. The memory device of claim 1, and further comprising a burst engine coupled to the controller wherein the burst engine is configured to generate a data strobe signal.

5. The memory device of claim 1, and further comprising a plurality of row address buffers coupled to the first and second memory arrays.

6. The memory device of claim 5, wherein the plurality of row address buffers are coupled to memory address lines through a first multiplexer and to the first and second memory arrays through a second multiplexer, wherein outputs of the first multiplexer and the second multiplexer are controlled by a control signal.

7. The memory device of claim 1, wherein the first plurality of data buffers are configured to store Y×T bits of data, error correction data, and an enable/disable flag wherein Y is a quantity of IO bits and T is a data burst length.

8. The memory device of claim 1, wherein the controller is configured to synchronize the data from the first plurality of data buffers with the error correction data from the second plurality of data buffers to transmit a first number of packets containing data from the first plurality of data buffers followed by a second number of packets containing error correction data from the second plurality of data buffers.

9. The memory device of claim 8, wherein the second number of packets is less than the first number of packets.

10. The memory device of claim 8, wherein the second number of packets is two packets.

11. A system comprising:
an external controller; and
a memory device coupled to the external controller over a command bus, an address bus, and a data bus, the memory device comprising:
a memory array;
one sense circuitry coupled to the memory array;
a first plurality of data buffers coupled to the sense circuitry;
a second plurality of data buffers coupled to the sense circuitry; and
a controller coupled to the first and second plurality of data buffers and configured to synchronize data from the first plurality of data buffers resulting from a read operation with error correction data from the second plurality of data buffers resulting from the read operation prior to transmitting the data and the error correction data.

12. The system of claim 11, wherein the external controller is configured to generate error correction data corresponding to data to be stored in the memory device and transmit the error correction data appended to the corresponding data over the data bus, wherein the error correction data comprises a plurality of error correction data packets for the corresponding data.

13. The system of claim 11, wherein the plurality of error correction data packets comprise a least significant error correction packet and a most significant error correction packet.

14. The system of claim 13, wherein the external controller is further configured to transmit the corresponding data as a plurality of packets of corresponding data followed by the plurality of error correction data packets.

15. The system of claim 14, wherein the plurality of packets of corresponding data is a number of packets equal to a burst length of the memory device.

16. A memory device comprising:
- a memory array configured to store data and to store error correction data;
- first sense circuitry coupled to the memory array;
- second sense circuitry coupled to the memory array;
- a first plurality of data buffers coupled to the first sense circuitry to store data sensed from the memory array;
- a second plurality of data buffers coupled to the second sense circuitry to store error correction data sensed from the memory array; and
- a controller coupled to the first and second plurality of data buffers and configured to synchronize data from the first plurality of data buffers resulting from a read operation with error correction data from the second plurality of data buffers resulting from the read operation prior to transmitting the data and the error correction data.

17. The memory device of claim 16, wherein the controller is further configured to transmit the data from the first plurality of data buffers as a plurality of data packets and to transmit error correction data from the second plurality of data buffers as a plurality of error correction data packets.

18. The system of claim 17, wherein the plurality of data packets is a number of packets equal to a burst length of the memory device.

19. The memory device of claim 18, wherein the controller is further configured to transmit a first number of packets of the plurality of data packets followed by a second number of packets of the plurality of error correction data packets.

20. The memory device of claim 19, wherein the second number of packets is two packets.

* * * * *